United States Patent [19]
Ray

[11] 3,986,127
[45] Oct. 12, 1976

[54] INTEGRATED FEEDBACK ACTIVE FILTER/INTEGRATOR

[75] Inventor: David J. Ray, Albuquerque, N. Mex.

[73] Assignee: The United States of America as represented by the Secretary of the Air Force, Washington, D.C.

[22] Filed: May 27, 1975

[21] Appl. No.: 581,176

[52] U.S. Cl. ............................. 328/128; 307/229; 328/127; 328/167
[51] Int. Cl.² ...................... G06G 7/18; G06G 7/12
[58] Field of Search ................. 328/127, 167, 128; 307/229; 333/19; 235/197, 182

[56] References Cited
UNITED STATES PATENTS

| | | | |
|---|---|---|---|
| 3,814,352 | 6/1974 | Grimes | 328/128 |
| 3,902,139 | 8/1975 | Harrell | 328/127 |
| 3,906,381 | 9/1975 | Bennett | 328/128 |

Primary Examiner—Stanley D. Miller, Jr.
Assistant Examiner—B. P. Davis
Attorney, Agent, or Firm—Joseph E. Rusz; George Fine

[57] ABSTRACT

An integrated feedback active filter/integrator processes electrical signals and performs bandpass and lowpass filtering or integration and double integration. The integrating and double integrating features are obtained by setting the quality factor of the bandpass filter to one half. This provides accurate integration for all frequencies greater than about ten times the center frequency of the filter. The circuit integrates the output and returns (feeds back) this value in the negative sense to the circuit input.

3 Claims, 1 Drawing Figure

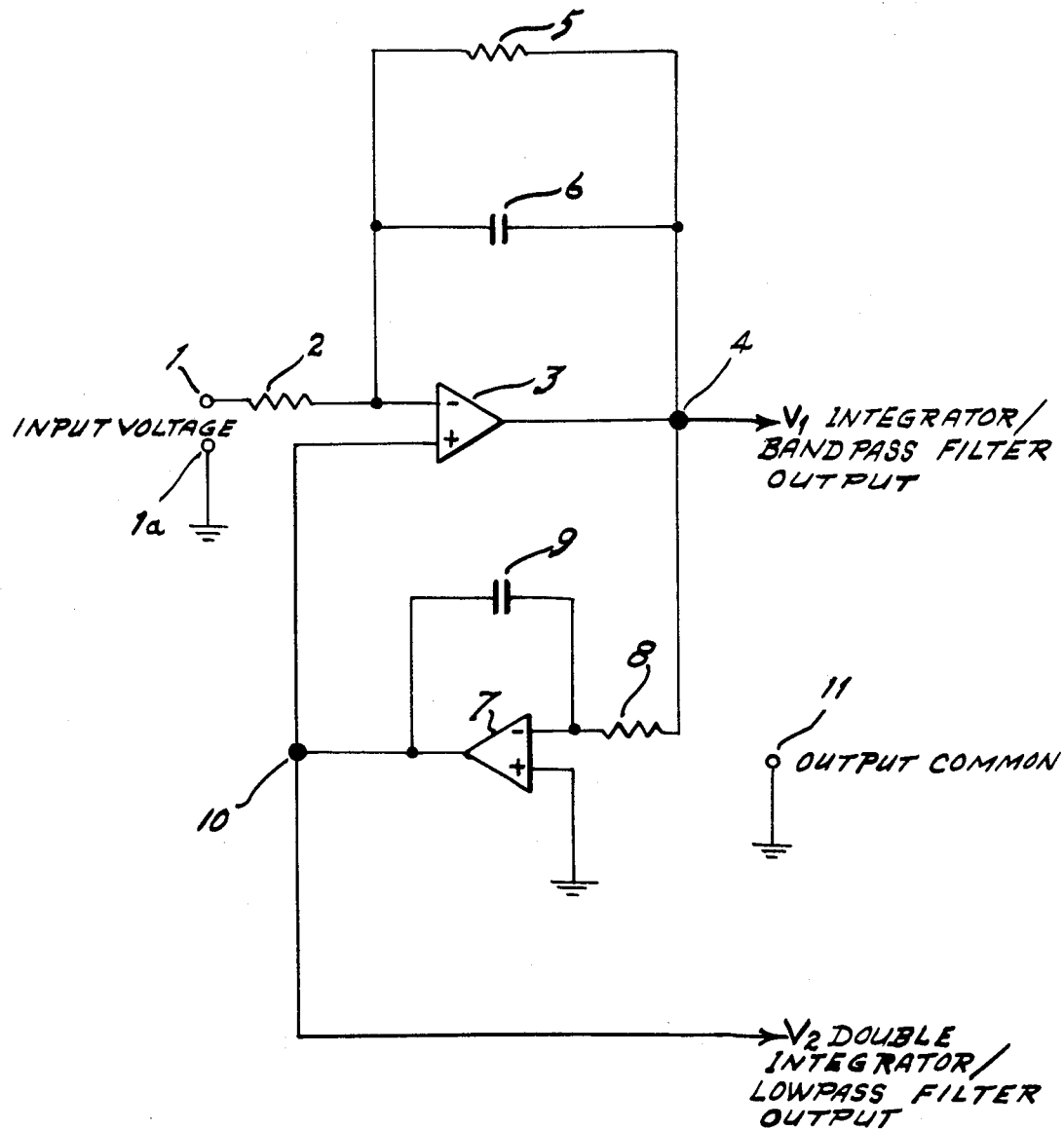

INTEGRATED FEEDBACK ACTIVE FILTER/INTEGRATOR

STATEMENT OF GOVERNMENT INTEREST

The invention described herein may be manufactured and used by or for the Government for governmental purposes without the payment of any royalty thereon.

BACKGROUND OF THE INVENTION

There exists a widespread utility for filtering/integration. However, there are limitations especially in integration in the prior art including DC offset and saturation. The present invention results in substantial improvement by integrating the circuit output and feeding it back negatively. The resultant DC offset and saturation which plagues other types of active integrators are eliminated. In addition, the circuit gives both the integral and the double integral of the input. A negative feedback feature also gives considerable stability to the circuit.

It is emphasized that the present circuit is a stable filter. Further, the circuit can integrate and double integrate signals having very low frequencies without saturating due to direct current offset on the input. It is noted that the circuit performs the aforesaid without using chopper stabilization or pulse modulation as in the prior art.

SUMMARY OF INVENTION

An integrated feedback active filter/integrator is provided. The circuit will serve as an integrator/double integrator/bandpass/lowpass filter. A pair of operational amplifiers are used, each of the amplifiers having associated resistors and capacitors in a predetermined relationship. The first operational amplifier provides an integrator/bandpass filter output and the second a double integrator/lowpass filter output. The integrating and double integrating features are obtained by setting the quality factor of the bandpass filter to one half. The circuit integrates the output and returns this value in a negative sense to the circuit input.

DESCRIPTION OF THE DRAWING

The single FIGURE of the invention shows partly in block and partly in diagrammatic form a preferred embodiment.

DETAILED DESCRIPTION OF PREFERRED EMBODIMENT

Now referring in detail to the single FIGURE, there is shown terminals 1 and 1a for reception of the input signal. Terminal 1a is connected to ground. Resistor 2 interconnects input terminal 1 and the negative terminal of first conventional operational amplifier 3. The output from operational amplifier 3 at point 4 is interconnected to the negative terminal of operational amplifier 3 by the parallel combination of resistor 5 and capacitor 6. From point 4 there is also provided an integrator/bandpass filter output. Terminal 11 represents the output common. The negative terminal of second conventional operational amplifier 7 is connected to output point 4 of first conventional amplifier 3 by way of resistor 8. The positive terminal of operational amplifier 7 is connected to ground. The negative terminal of operational amplifier 7 is connected to the output thereof by way of capacitor 9. Output point 10 is connected to the positive terminal of operational amplifier 3 and also provides therefrom a double integrator/low pass filter output.

It is noted that in the following equations resistor 1 is represented by a predetermined value $R_1$, resistor 8 by a predetermined value $R_2$, resistor 5 by a predetermined value $R_d$, capacitor 6 by a predetermined value $C_1$, and capacitor 9 by a predetermined value $C_2$, $V_1$ the output voltage from point 4, and $V_2$ the output voltage from point 10.

The output voltage relationship to the input voltage in Laplace notation is:

$$V_1 = \frac{\frac{1}{R_1 C_1} S}{S^2 + \left(\frac{1}{R_d C_1} + \frac{1}{R_2 C_2}\right) S + \frac{1}{R_2 C_2} + \left(\frac{1}{R_d C_1} + \frac{1}{R_1 C_1}\right)} \text{input voltage}$$

$$V_2 = \frac{\frac{1}{R_1 C_1 R_2 C_2}}{S^2 + \left(\frac{1}{R_d C_1} + \frac{1}{R_2 C_2}\right) S + \frac{1}{R_2 C_2} \left(\frac{1}{R_d C_1} + \frac{1}{R_1 C_1}\right)} \text{input voltage}$$

If $V_1$ is to be used as a bandpass filter then the center frequency and bandwidth are given as $$W = \sqrt{\frac{1}{R_2 C_2} \frac{1}{R_d C_1} + \frac{1}{R_1 C_1}}$$

$$BW = \frac{1}{R_d C_1} + \frac{1}{R_2 C_2}$$

If the circuit is to be used as an integrator or double integrator then the following relationships between component values must be observed:

$$\frac{1}{R_d C_1} + \frac{1}{R_2 C_2} = 2 \sqrt{\frac{1}{R_2 C_2} \left(\frac{1}{R_d C_1} + \frac{1}{R_1 C_1}\right)}$$

and the lowest frequency or frequency component to be integrated should be 10 times the value $\omega_c$ where $$\omega_c = \sqrt{\frac{1}{R_2 C_2} \left(\frac{1}{R_d C_1} + \frac{1}{R_1 C_1}\right)}$$

if very low distortion in the output is desired. If more distortion in the output can be tolerated the lowest input frequency may be closer to $\omega_c$ but in any case all frequencies and frequency components must be greater than $\omega_c$. It is to be noted that the offset problem (integration of any offset in the input results in a ramp in the output of most analog integrators but not in this circuit) is reduced to insignificance with this circuit. Also it is important to note that no expensive signal choppers or pulse modulation circuits are needed. Further, the distortion free low frequency response is limited only by the size of the capacitors available. The prototype design was able to integrate a pulse wave of 0.02 Hz with less than 1 percent distortion and no measurable ramp was seen in the output.

It is noted that ground motion studies depend on test data from actual conventional and nuclear blasts. Accelerometers are the most reliable type of sensor. The invention described herein when connected to and in combination with an accelerometer gives ground velocity and displacement data immediately after the blast.

What is claimed is:

1. An integrator and filter apparatus to provide integration, double integration and filtering comprising a first operational amplifier having first negative and first positive input terminals and a first output terminal, first and second signal input terminals, said second input terminal being grounded, a first resistor having the predetermined value of $R_1$, said first resistor interconnecting said first signal input terminal and said first negative input terminal, a parallel combination of a first capacitor and second resistor interconnecting said first output terminal and said first negative terminal, said first capacitor and said second resistor having a predetermined value of $C_1$ and $R_d$, respectively, said first output terminal providing an integrator output signal and a bandpass filter output, a second operational amplifier having second negative and positive terminals and a second output terminal, a third resistor interconnecting said first output terminal and said second negative terminal, said third resistor having a predetermined value of $R_2$, a second capacitor interconnecting said second negative terminal and said second output terminal, said second capacitor having a predetermined value of $C_2$, said first positive terminal connected to said second output terminal and providing a double integrator output signal and a low pass filter output in accordance with the relationship between capacitor and resistor value.

2. An integrator and filter apparatus as described in claim 1 wherein said resistors and capacitors observe the relationship of $$\frac{1}{R_d C_1} + \frac{1}{R_2 C_2} = 2 \sqrt{\frac{1}{R_2 C_2} \left( \frac{1}{R_d C_1} + \frac{1}{R_1 C_1} \right)}.$$

3. An integrator and filter apparatus as defined in claim 1 wherein said first operational amplifier also operates as a bandpass filter with the center frequency and bandwidth being determined by the relationship of said capacitors and resistors in accordance with the equations $$W = \sqrt{\frac{1}{R_2 C_2} \left( \frac{1}{R_d C_1} + \frac{1}{R_1 C_1} \right)} \text{ and}$$

$$\text{bandwidth} = \frac{1}{R_d C_1} + \frac{1}{R_2 C_2},$$

respectively.

* * * * *